US006537917B2

(12) United States Patent
Lai et al.

(10) Patent No.: US 6,537,917 B2
(45) Date of Patent: Mar. 25, 2003

(54) METHOD FOR FABRICATING ELECTRICALLY INSULATING LAYERS

(75) Inventors: Jiun-Ren Lai, Pingtung (TW); Chien-Wei Chen, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 91 days.

(21) Appl. No.: 09/803,921

(22) Filed: Mar. 13, 2001

(65) Prior Publication Data

US 2002/0132484 A1 Sep. 19, 2002

(51) Int. Cl.[7] .............................................. H01L 21/302
(52) U.S. Cl. ..................... 438/694; 438/697; 438/700; 438/712; 438/719; 438/724; 438/725
(58) Field of Search ................................ 438/694, 697, 438/700, 712, 719, 724, 725, 744

(56) References Cited

U.S. PATENT DOCUMENTS 6,251,746 B1 * 6/2001 Hong et al. .................. 438/424
6,309,947 B1 * 10/2001 Bandyopadhyay et al. . 438/424
6,329,266 B1 * 12/2001 Hwang et al. ............... 438/424

* cited by examiner

Primary Examiner—Benjamin L. Utech
Assistant Examiner—Binh X. Tran (57) ABSTRACT

This invention relates to a method for fabricating a electrically insulating layer, more particularly, to the method for fabricating a electrically insulating layer by using the different etching rates in etching oxide and etching nitride. The present invention uses the way in different etching rates to etch oxide and nitride. When begin the etching process to fabricating the electrically insulating layer, the etching rate of oxide is higher than the etching rate of nitride. When the oxide layer contacts with the ending point which is situated between the oxide layer and the nitride layer or the nitride oxide layer, the etching rate of nitride is higher than the etching rate of oxide to form the flatter surface of the electrically insulating layer.

12 Claims, 7 Drawing Sheets

METHOD FOR FABRICATING ELECTRICALLY INSULATING LAYERS

BACKGROUND OF THE INVENTION

1. Field of the Invention

This invention relates to a method for fabricating a electrically insulating layer, more particularly, to the method for fabricating a electrically insulating layer by using the different etching rates in etching oxide and etching nitride. The surface of the electrically insulating layer, which is formed by using the present invention method, is flatter to increase the window of the back-end processes and the qualities of the products.

2. Description of the Prior Art

In the continual improvement of semiconductor integrated circuit fabrication techniques, the number of devices that can be packed onto a semiconductor chip has increased greatly, while the geometric dimensions of the individual device has been markedly reduced. In today's fabricating process, the feature size has shrunk into the sub-micron range. In such high-density chips, each of the elements must be isolated properly in order to obtain good electrical characteristics. Device isolation technology has been developed to fulfill the above requirement, the main purpose of which is to provide good insulation between the elements using a smaller isolation area so that there is additional space for building more elements.

Figure 1:
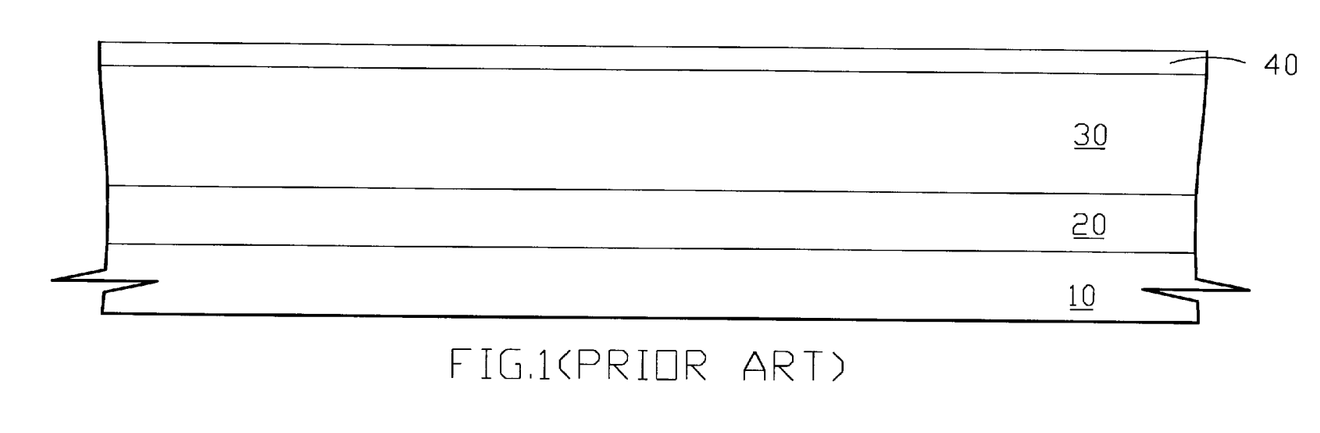
FIG. 1 shows a diagram in forming a silicon layer, a nitride layer, and a nitride oxide layer on a substrate of a wafer.

Referring to FIG. 1, at first a wafer, which comprises a substrate 10, is provided and a silicon layer 20 is formed on the substrate 10. The material of the substrate 10 can be the silicon substrate and the material of the silicon layer 20 can be the poly-silicon. Next, a nitride layer 30 is formed on the silicon layer 20. The material of the nitride layer can be silicon nitride to be the mask. Then a nitride oxide layer 40 is formed on the nitride layer 30 to be the anti-reflective layer. This anti-reflective layer can increase the qualities of the photolithography process and the silicon nitride oxide is usually used to be the material of the nitride oxide layer 40.

Figure 2:
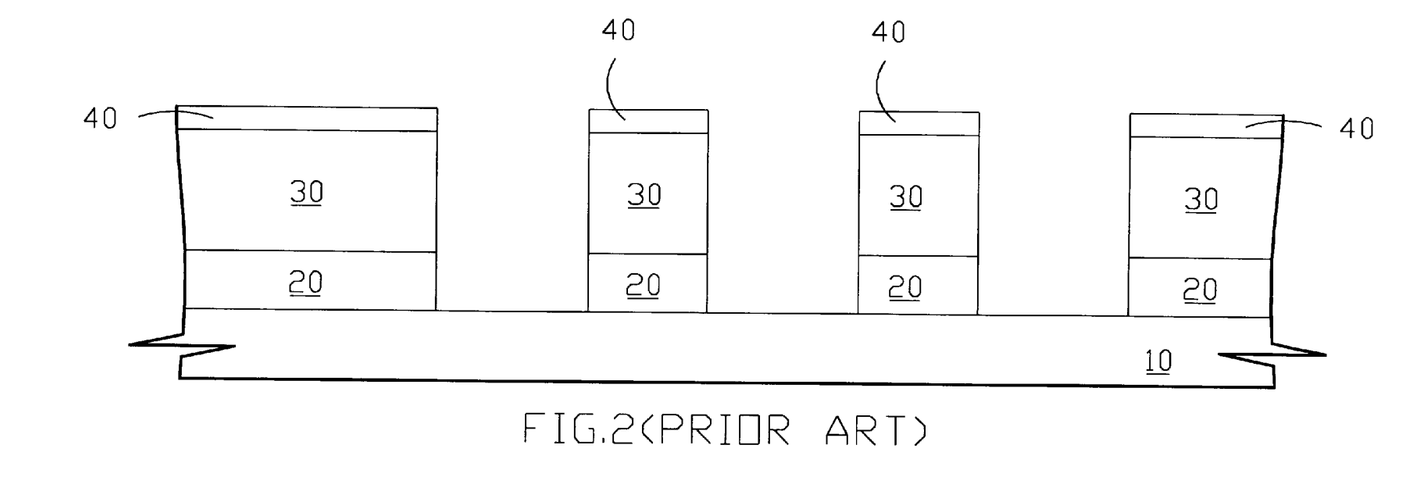
FIG. 2 shows a diagram in forming plural trenches on the wafer.
Figure 3:
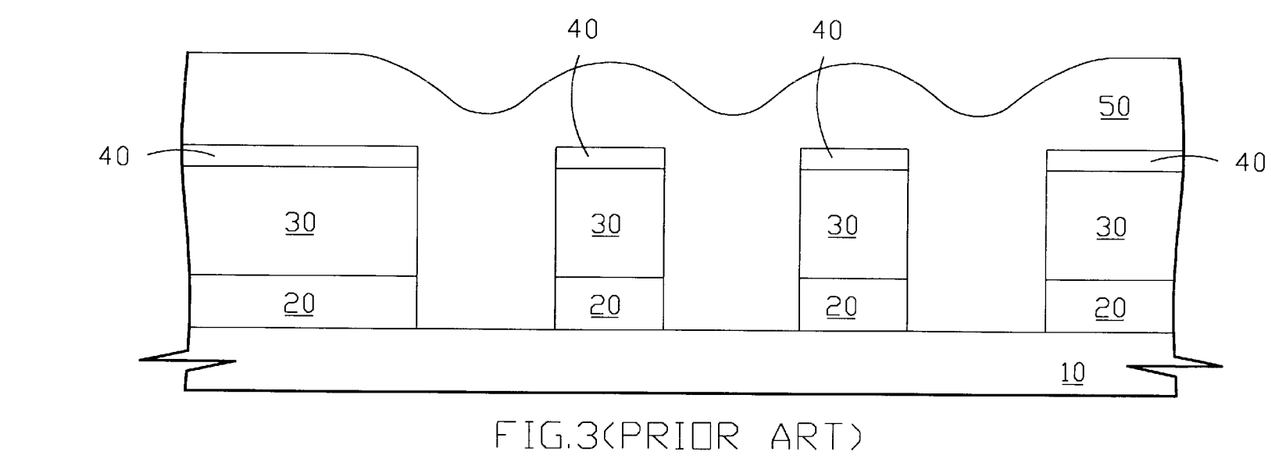
FIG. 3 shows a diagram in forming a oxide layer into the trenches and filling of the trenches.

Referring to FIG. 2, after deciding the location of the elements and the insulating layers on the nitride oxide layer 40, the plural trenches are formed on the wafer by using the photolithography and etching processes. The substrates are showed at the bottom of the trenches. Referring to FIG. 3, oxide is filled into the trench and is filled of the trench to fabricate the oxide layer 50 to be the electrically insulating layer. The chemical mechanical polishing (CMP) process is usually used to fabricate the oxide layer 50. Tetraethylorthosilicate (TEOS) or the mixture which comprises ozone and tetraethylorthosilicate are usually used to be the material of the oxide layer 50.

Figure 4:
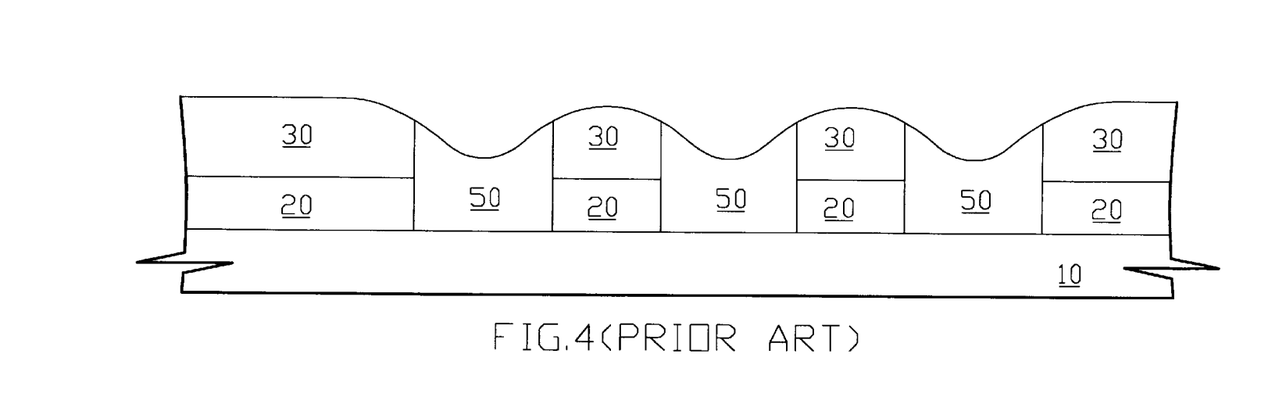
FIG. 4 shows a diagram in etching nitride oxide layer and oxide layer which is over deposition.
Figure 5:
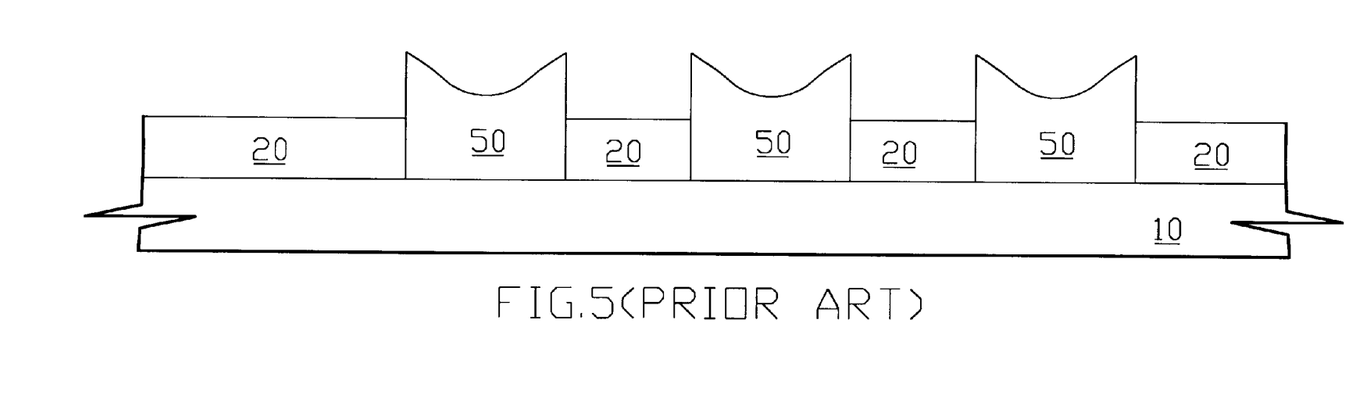
FIG. 5 shows a diagram in removing the nitride layer to form the electrically insulating layer between the silicon layers.

Referring to FIG. 4, then the nitride oxide layer 40 and the oxide layer 50 which is over deposition are removed by using the etching back method or the chemical mechanical polishing method. The etching back method is usually used in this process and the etching rate of the oxide layer 50 is higher than the rate of the nitride oxide layer 40. In according to ensure the nitride oxide layer 40 is removed completely, the over etching way is usually used to etch the part of the nitride layer. Referring to FIG. 5, after the nitride layer 30 is removed, the electrically insulating layer is fabricated on the wafer to insulate the elements which are on the wafer and to avoid the leakage defects.

Following the advancements of the semiconductor process, the width of the line is smaller and smaller. Therefore, the electrically insulating layer, which is formed by using the traditional technology, will occur several defects to affect the qualities of the semiconductor. When the oxide layer is deposited, the conformity characteristic of the oxide layer will cause a indention curve line which is formed between the interface which is between the nitride layer and the silicon layer and the interface which is between the nitride layer and the nitride oxide layer. After passing through the etching back process or the chemical mechanical polishing process, the curve line will make the surface of the electrically insulating layer show sharp corners on both sides. These sharp corners will cause the serious effects in the follow-up film deposition process to occur the break problems in the film at the place of the sharp corners. Therefore, the present invention must be used to make the flatter surface of the electrically insulating layer.

Because the sharp corner is formed, the step height between the silicon layer and the electrically insulating layer will become higher after the nitride layer is removed. This condition will make the window become not enough and will need to cost more time in the follow-up etching process. Therefore, the present invention must be used to avoid the sharp corners to be produced to increase the efficiency of the whole process.

When the traditional technology is used to fabricate the electrically insulating layer, the indention curve line will be formed between the interface which is between the nitride layer and the silicon layer and the interface which is between the nitride layer and the nitride oxide layer. After passing through the etching back process or the chemical mechanical polishing process, the curve line will make the effective thickness of the electrically insulating layer become thinner to reduce the ability of the electrically insulating layer in resisting the diffusion ions in the follow-up process. This condition will reduce the qualities of the products. Therefore, the present invention must be used to decrease the radian of the indention curve.

SUMMARY OF THE INVENTION

In accordance with the above-mentioned invention backgrounds, the traditional method can not solve the defects in forming the sharp corners on the surface of the electrically insulating layer. The present invention provides a method for forming the flatter surface of the electrically insulating layer by using the different etching rates in etching oxide and etching nitride in the two steps etching process to increase the qualities of the products.

The second objective of this invention is to increase the width of the follow-up process by using the different etching rates in etching oxide and etching nitride in the two steps etching process to form the flatter surface of the electrically insulating layer.

The third objective of this invention is to increase the effective thickness of the electrically insulating layer and to increase the ability of the electrically insulating layer in resisting the diffusion ions in the follow-up process by using the different etching rates in etching oxide and etching nitride in the two steps etching process to form the flatter surface of the electrically insulating layer.

The fourth objective of this invention is to increase the efficiency of the whole process by using the different etching rates in etching oxide and etching nitride in the two steps etching process to form the flatter surface of the electrically insulating layer.

It is a further objective of this invention is to decrease the production costs by using the different etching rates in etching oxide and etching nitride in the two steps etching process to form the flatter surface of the electrically insulating layer.

In according to the foregoing objectives, the present invention provides a method for forming the flatter surface of the electrically insulating layer by using the different etching rates in etching oxide and etching nitride in the two steps etching process. The flatter surface of the electrically insulating layer will avoid to show the sharp corners on the both sides of the surface and will avoid to cause the break problems in the film at the place of the sharp corners in the follow-up film deposition process. This condition can increase the qualities of the semiconductor products and the width of the follow-up process. The present invention can also use the flatter surface of the electrically insulating layer to increase the effective thickness of the electrically insulating layer and to increase the ability of the electrically insulating layer in resisting the diffusion ions in the follow-up process. The present invention can further increase the efficiency of the whole process and decrease the production costs.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

In the manufacture of highly dense integrated circuits, individual device structures are typically separated and electrically isolated by means of a field oxide isolation region. The isolation region is typically produced by the exposure of a silicon wafer to an oxidizing atmosphere while using an oxidation mask to protect regions which are not desired to be oxidized. These latter regions will be the location for the active device structures. One widely used technique for creating isolation regions is LOCal Oxidation of Silicon (LOCOS). Following the advancements of the semiconductor process, the width of the line is smaller and smaller. The electrically insulating layer which was fabricated by using the LOCOS way in the past is fabricated by using the process which is similar to the damascene process at present stage by stage.

Figure 6:
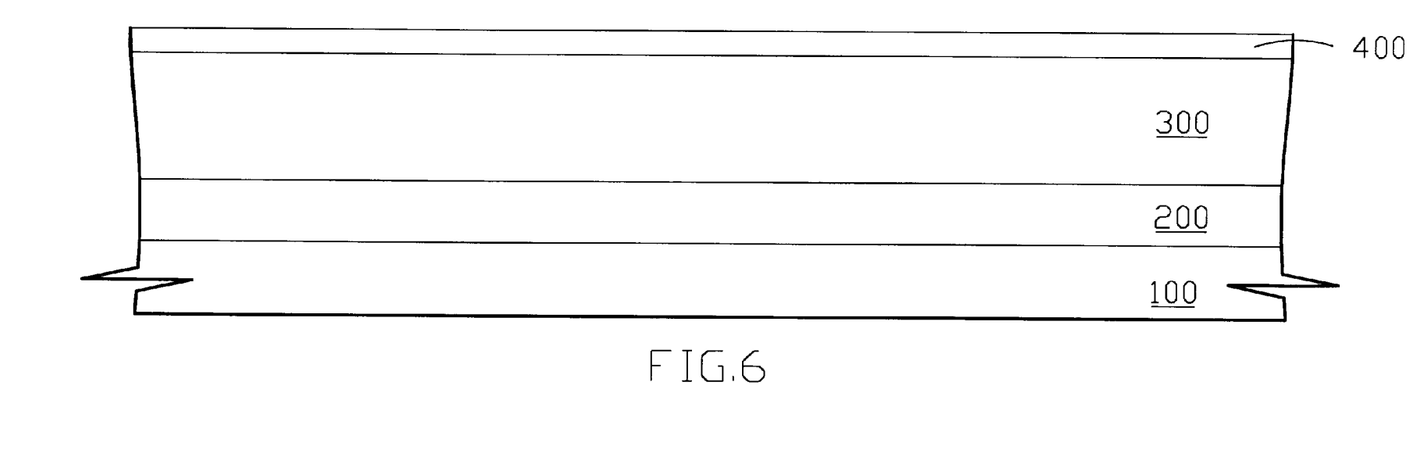
FIG. 6 shows a diagram in forming a silicon layer, a nitride layer, and a nitride oxide layer on a substrate of a wafer.

Referring to FIG. 6, at first a wafer, which comprises a substrate 100, is provided and a silicon layer 200 is formed on the substrate 100. The material of the substrate 100 can be the silicon substrate and the material of the silicon layer 200 can be polysilicon. Next, a nitride layer 300 is formed on the silicon layer 200. The material of the nitride layer can be silicon nitride to be the mask. Then a nitride oxide layer 400 is formed on the nitride layer 300 to be the anti-reflective layer. This anti-reflective layer can increase the qualities of the photolithography process but the nitride oxide layer 400 is not must used in the fabricating electrically insulating layer process. Silicon nitride oxide is usually used to be the material of the nitride oxide layer 400.

Figure 7:
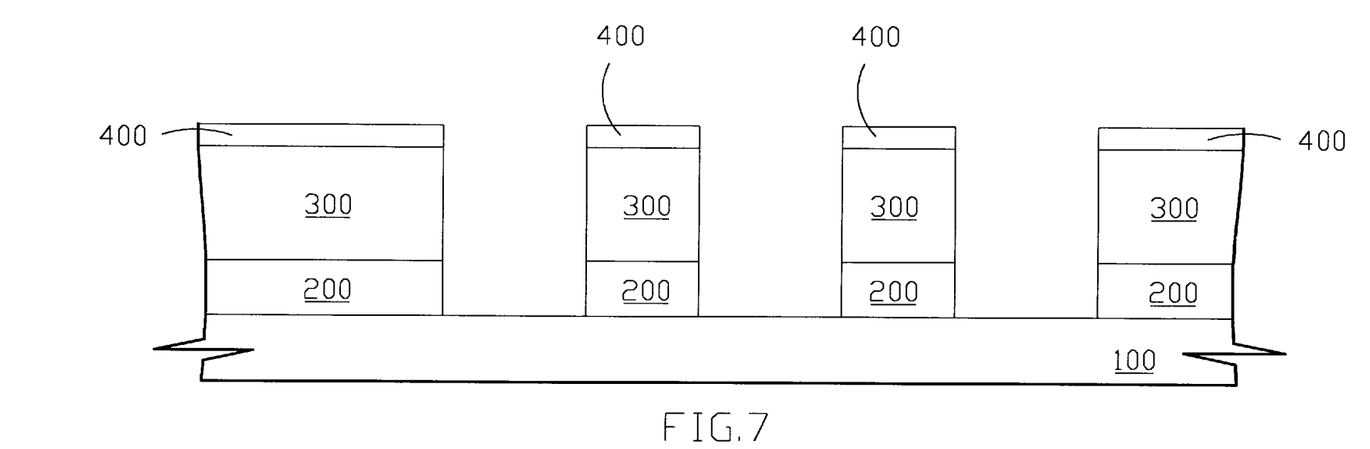
FIG. 7 shows a diagram in forming plural trenches on the wafer.
Figure 8:
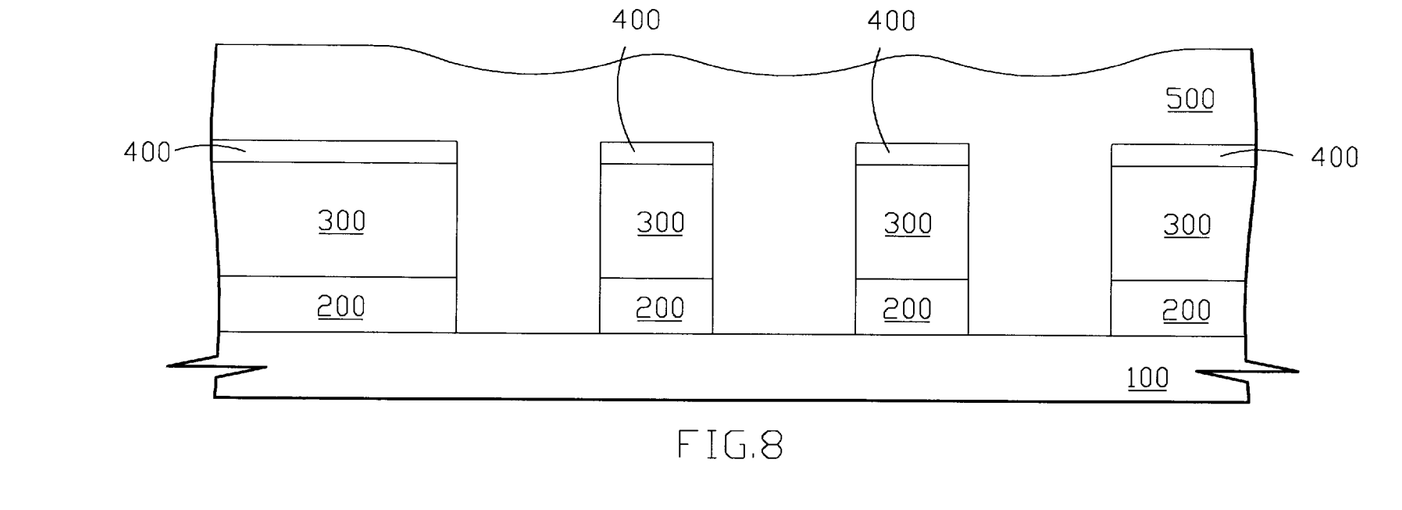
FIG. 8 shows a diagram in forming a oxide layer into the trenches and filling of the trenches.

Referring to FIG. 7, after deciding the location of the elements and the insulating layers on the nitride oxide layer 40o, the plural trenches are formed on the wafer by using the photolithography and etching processes. The trenches pass through the nitride oxide layer 400, the nitride layer 300, and the silicon layer 200 and the substrates are showed at the bottom of the trenches. Referring to FIG. 8, oxide is filled into the trench and is filled of the trench to fabricate the oxide layer 500 to be the electrically insulating layer. The chemical mechanical polishing (CMP) process is usually used to fabricate the oxide layer 500. Tetraethylorthosilicate (TEOS) or the mixture, which comprises ozone and tetraethylorthosilicate, is usually used to be the material of the oxide layer 500. When the width of the line is smaller and smaller, the mixture, which comprises ozone and tetraethylorthosilicate, is usually used to be the material of the oxide layer 500 to form the needful electrically insulating layer into the trenches successfully.

Then the two steps etching process will be proceeded. At first the etching back way is used in the first step of the etching process to remove the oxide layer 500 which is over deposition. At this time, the etching rate of oxide is higher than the etching rate of nitride. Because nitride oxide is one kind of nitride, the nitride oxide is following to proceed the etching process when the nitride is in the etching process. The etching rate of nitride oxide is about equal to the etching rate of nitride.

Figure 9:
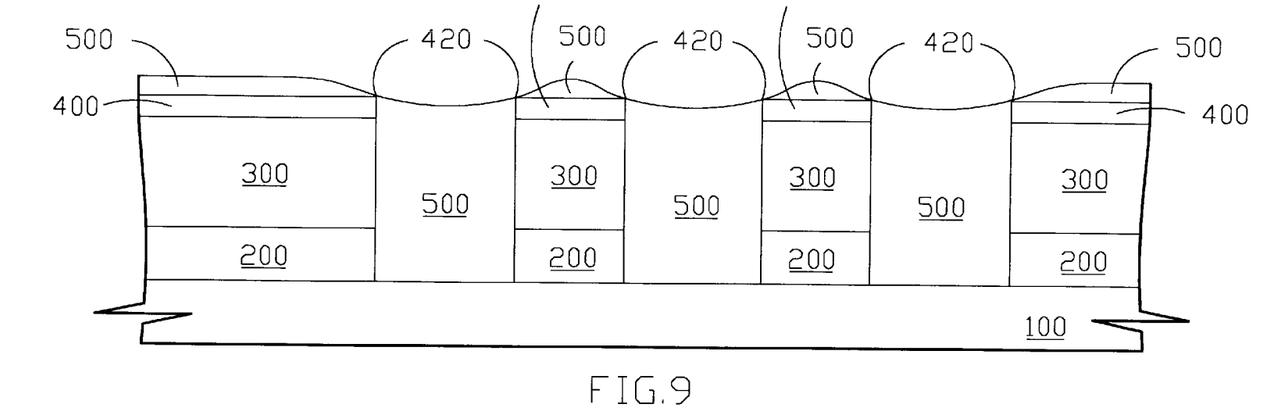
FIG. 9 shows a diagram in etching the oxide layer to the end point which is between the oxide layer and the nitride oxide layer.

When the oxide layer is etched to the end point 420 which contacts with the oxide layer 500 and the nitride oxide layer 400 (referring to FIG. 9) in the fabricating electrically insulating process which uses the nitride oxide layer to be the anti-reflection layer, the second step etching process is proceed. The etching rate is adjusted to make the etching rate of nitride higher than the etching rate of oxide. If the nitride oxide layer is not used in the process to be the anti-reflective layer, the etching rate is adjusted to make the etching rate of nitride higher than the etching rate of oxide when the oxide layer is etched to the end point 420 which contacts with the oxide layer and the nitride layer.

The spectrum analysis way can decide whether the oxide layer is etched to the end point which contacts with the oxide layer and the nitride oxide layer or the nitride layer or not. In the first step etching process, most of time is to proceed oxide etching. The bonds between carbon atoms and oxygen atoms will be mostly found by using the spectrum analysis way. When the increased amounts of bonds, which are between carbon atoms and nitrogen atoms, are found by using the spectrum analysis way, the oxide layer is decided to reach to the end point which contacts with the oxide layer and the nitride oxide layer or the nitride layer. Then the etching rate is adjusted to make the etching rate of nitride higher than the etching rate of oxide to proceed the second step etching process.

Figure 10:
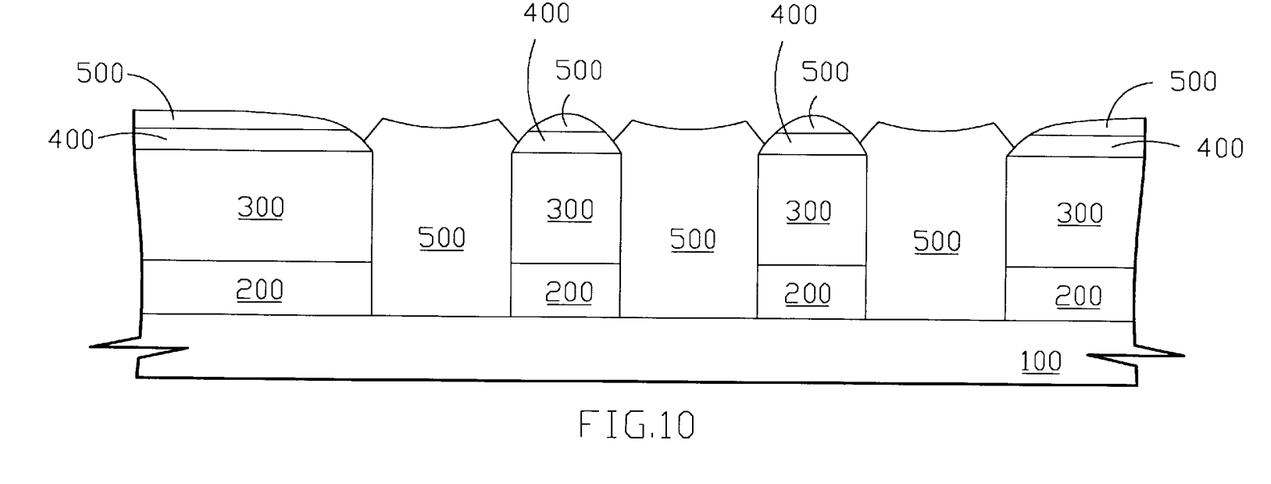
FIG. 10 shows a diagram in using the higher etching rate to etch oxide in the etching process, wherein the etching rate of oxide is higher than the etching rate of nitride.

Referring to FIG. 10, when proceeding the second step etching process, the etching rate of nitride is higher than the etching rate of oxide. The objective of this art is to expose the intervals on both sides of the nitride oxide layer 400 and on both sides of the top of the oxide layer 500. This condition can make the sharp corners, which are formed by using traditional technology on both sides of the oxide layer 500, be pared off gradually by the increased probability of the molecule collision and the increased etching rate of the sharp corner place. Therefore, the present invention can improve the characteristic of the film in the follow-up process.

Figure 11:
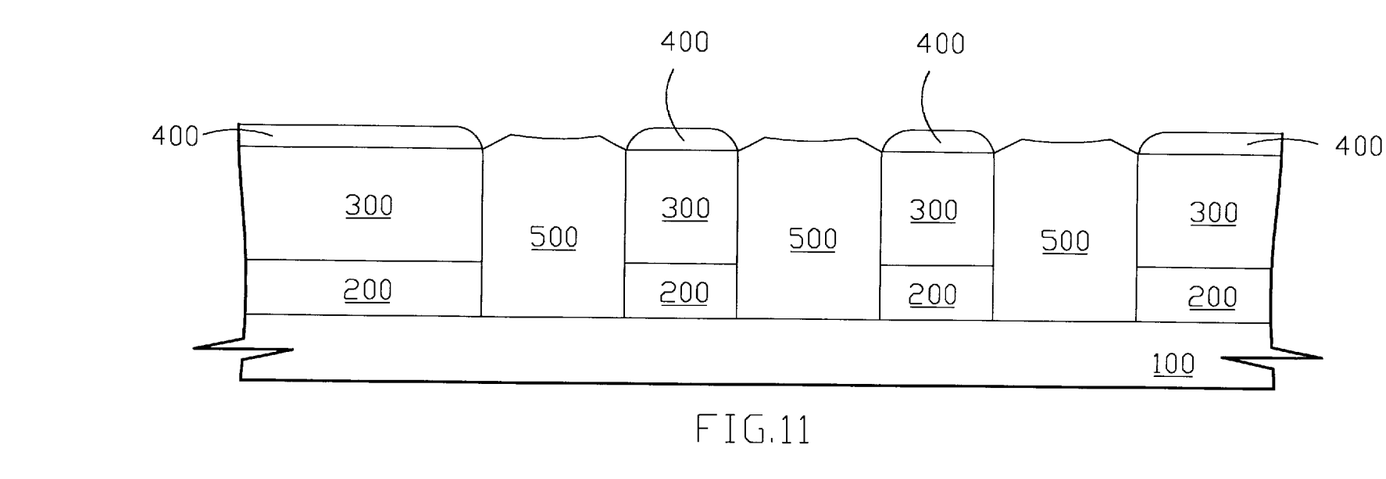
FIG. 11 shows a diagram in using the higher etching rate to etch nitride in the etching process, wherein the etching rate of nitride is higher than the etching rate of oxide.

Referring to FIG. 11, after the oxide layer 500 which is over deposited on the nitride oxide layer 300, keeping the etching rate of the second step etching process to remove the nitride oxide layer 400. In other words, the etching rate of nitride is still higher than the etching rate of oxide.

Figure 12:
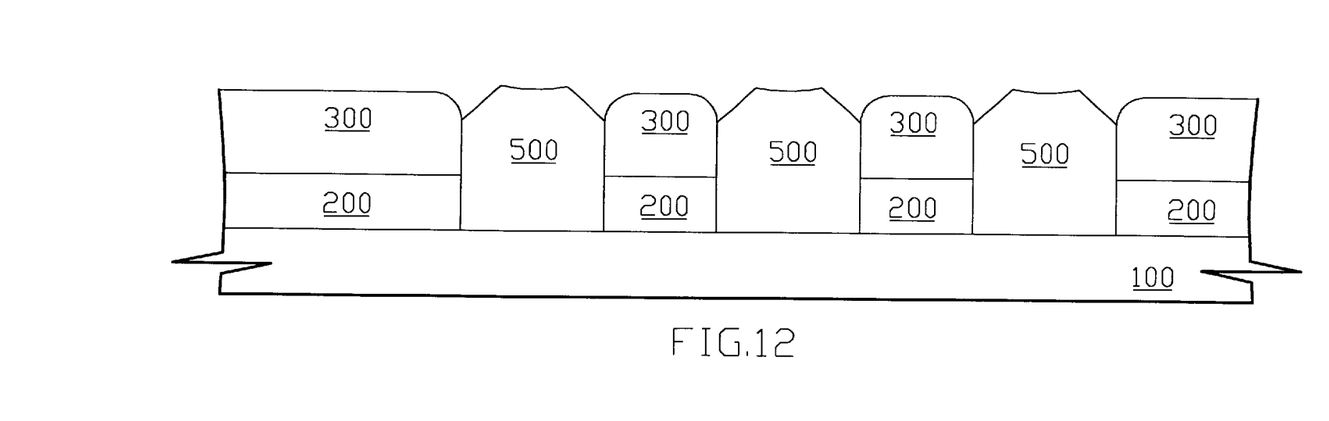
FIG. 12 shows a diagram in removing the nitride oxide layer by using the higher etching rate to etch nitride in the etching process, wherein the etching rate of nitride is higher than the etching rate of oxide.

Referring to FIG. 12, because the nitride oxide layer 400 is not exist on the nitride layer 300 in the follow-up removing nitride layer 300 process, the over etching process will be proceeded enough to remove the nitride oxide layer 400 completely in the process. If part of the nitride oxide layer remains on the nitride layer, the nitride layer will not be removed easily and will retain on the silicon layer 200. This over etching process will also decrease the thickness of the oxide layer 500 to affect the ability of the electrically insulating layer in resisting the diffusion ions in the follow-up process. But the thickness of the oxide layer 500 which is fabricated by using the present invention method is thicker than the thickness of the oxide layer 500 which is fabricated by using the traditional technology. Therefore, the ability of the electrically insulating layer in resisting the diffusion ions is also higher in the follow-up process.

Figure 13:
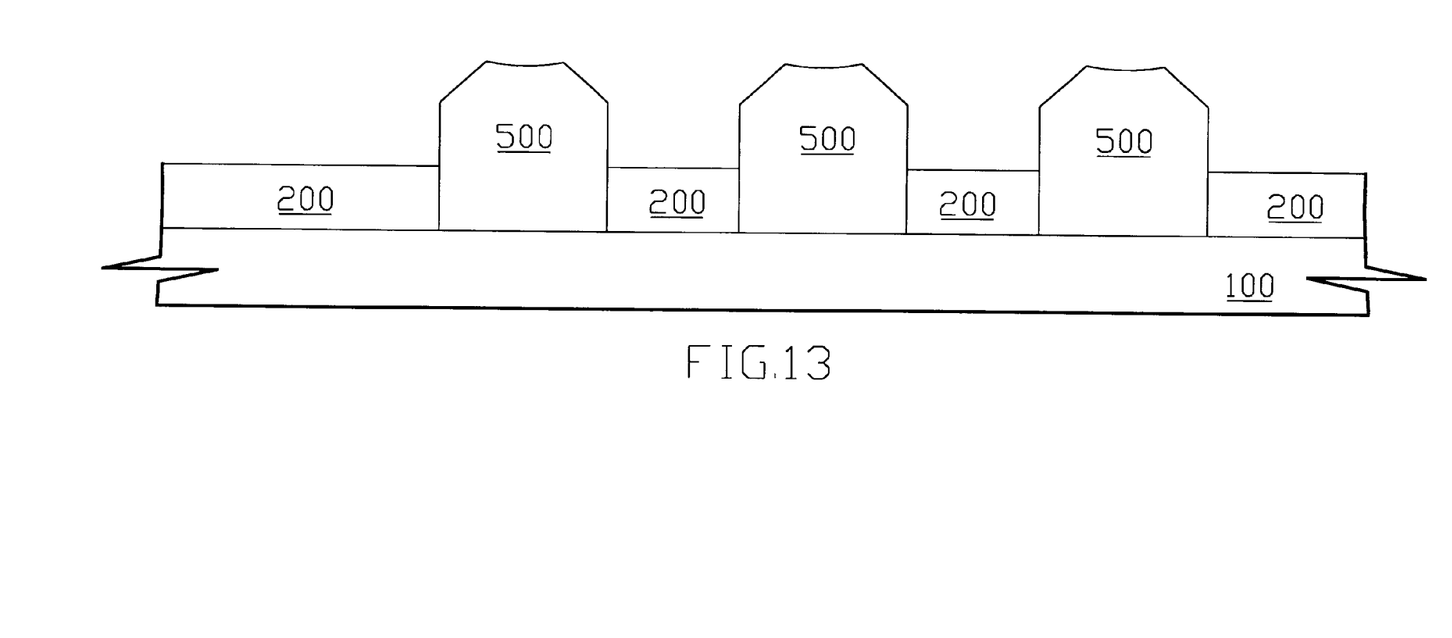
FIG. 13 shows a diagram in removing the nitride layer to form the electrically insulating layer between the silicon layers.

Referring to FIG. 13, after removing the nitride layer 300 by using the wet etching method, the oxide layer 500 whose surface is flatter is fabricated between the silicon layers 200 to be the electrically insulating layer. Because the surface of the electrically insulating layer is flatter, the thickness of the electrically insulating layer is more uniform and the step height between the electrically insulating layer and the silicon layer is smaller. This condition can reduce the etching time in the follow-up process and still obtain the width of the window in the etching process.

In accordance with the present invention, the present invention provides a method for forming the flatter surface of the electrically insulating layer by using two steps etching process. In the first step etching process, the etching rate of oxide is higher than the etching rate of nitride. In the second step etching process, the etching rate of nitride is higher than the etching rate of oxide. The flatter surface of the electrically insulating layer will avoid to show the sharp corners on the both sides of the surface and will avoid to cause the break problems in the film at the place of the sharp corners in the follow-up film deposition process. This condition can increase the qualities of the semiconductor products and the width of the follow-up process. The present invention can also use the flatter surface of the electrically insulating layer to increase the effective thickness of the electrically insulating layer and to increase the ability of the electrically insulating layer in resisting the diffusion ions in the follow-up process. The present invention can further increase the efficiency of the whole process and decrease the production costs.

Although specific embodiments have been illustrated and described, it will be obvious to those skilled in the art that various modifications may be made without departing from what is intended to be limited solely by the appended claims.

What is claimed is:

1. A method for forming an electrically insulating layer, said method comprises:

providing a wafer, said wafer comprises a substrate;

forming a silicon layer on said substrate;

forming a nitride layer on said silicon layer;

etching part of said nitride layer and part of said silicon layer to form a trench, said substrate to be exposed at the bottom of said trench;

forming a tetraethylorthosilicate layer into said trench and on said nitride layer and filling said trench to form said electrically insulating layer;

performing an etching process to etch said tetraethylorthosilicate layer until said nitride layer being exposed, the recipe of said etching process being adjusted to let the etching rate of said tetraethylorthosilicate layer be higher than the etching rate of said nitride layer;

performing an etching process to etch both said tetraethylorthosilicate layer and said nitride layer until upper portion of said nitride layer being removed, the recipe of said etching process being adjusted to let the etching rate of said tetraethylorthosilicate layer be lower than the etching rate of said nitride layer; and removing said nitride layer.

2. The method according to claim 1, wherein a material of said substrate is a silicon.

3. The method according to claim 1, wherein a material of said nitride layer is a silicon nitride.

4. The method according to claim 1, wherein a material of said electrically insulating layer is a mixture which comprises ozone and tetraethylorthosilicate.

5. A method for forming an electrically insulating layer, said method comprises:

providing a wafer, said wafer comprises a substrate;

forming a silicon layer on said substrate;

forming a nitride layer on said silicon layer;

forming a nitride oxide layer on said nitride layer;

etching part of said nitride oxide layer, part of said nitride layer, and part of said silicon layer to form a trench, said substrate to be exposed at the bottom of said trench;

forming an oxide layer into said trench and on said nitride oxide layer and filling of said trench to form said electrically insulating layer, a material of said oxide layer comprising a tetraethylorthosilicate;

performing an etching process to etch said oxide layer until said nitride oxide layer being exposed, the recipe of said etching process being adjusted to let the etching rate of said oxide layer be higher than the etching rate of said nitride oxide layer;

performing an etching process to etch both said oxide layer and said nitride oxide layer until said nitride layer being exposed, the recipe of said etching process being adjusted to let the etching rate of said oxide layer be lower than the etching rate of said nitride oxide layer; and removing said nitride layer.

6. The method according to claim 5, wherein a material of said substrate is a silicon.

7. The method according to claim 5, wherein a material of said nitride layer is a silicon nitride.

8. The method according to claim 5, wherein a material of said electrically insulating layer is a mixture which comprises ozone and tetraethylorthosilicate.

9. The method according to claim 5, wherein a material of said nitride oxide layer is a silicon nitride oxide.

10. The method according to claim 5, wherein a material of said electrically insulating layer is a mixture which comprises ozone and tetraethylorthosilicate.

11. A method for forming an electrically insulating layer, said method comprises:

providing a wafer, said wafer comprises a substrate;

forming a silicon layer on said substrate;

forming a silicon nitride layer on said silicon layer;

forming a silicon nitride oxide layer on said silicon nitride layer;

etching part of said silicon nitride oxide layer, part of said silicon nitride layer, and part of said silicon layer to form a trench, said substrate to be exposed at the bottom of said trench;

forming an oxide layer into said trench and on said silicon nitride oxide layer and filling of said trench to form said electrically insulating layer, a material of said oxide layer comprising a tetraethylorthosilicate;

performing an etching process to etch said oxide layer until said silicon nitride oxide layer being exposed, the recipe of said etching process being adjusted to let the etching rate of said oxide layer be higher than the etching rate of said silicon nitride oxide layer;

performing an etching process to etch both said oxide layer and said silicon nitride oxide layer until said silicon nitride layer being exposed, the recipe of said etching process being adjusted to let the etching rate of said oxide layer be lower than the etching rate of said silicon nitride oxide layer; and removing said silicon nitride layer.

12. The method according to claim 11, wherein a material of said substrate is a silicon.

* * * * *